(12) United States Patent
Qin et al.

(10) Patent No.: US 7,408,119 B2
(45) Date of Patent: Aug. 5, 2008

(54) ELECTRICAL INTERCONNECTION FOR HIGH-FREQUENCY DEVICES

(75) Inventors: Xiaohui Qin, Santa Rosa, CA (US); Deji Akinwande, Falls Church, VA (US); James P. Stephens, Sebastopol, CA (US); Robin Zinsmaster, Sebastopol, CA (US); Jim Clatterbaugh, Santa Rosa, CA (US)

(73) Assignee: Agilent Technologies, Inc., Santa Clara, CA (US)

( * ) Notice: Subject to any disclaimer, the term of this patent is extended or adjusted under 35 U.S.C. 154(b) by 478 days.

(21) Appl. No.: 10/687,225

(22) Filed: Oct. 15, 2003

(65) Prior Publication Data

US 2005/0083153 A1    Apr. 21, 2005

(51) Int. Cl.
*H01R 12/04*    (2006.01)
*H05K 1/11*    (2006.01)

(52) U.S. Cl. ............... 174/261; 174/260; 174/268; 257/737; 257/785

(58) Field of Classification Search ............... 174/268, 174/261, 260; 257/780, 784, 785, 737–738
See application file for complete search history.

(56) References Cited

U.S. PATENT DOCUMENTS

| | | | | |
|---|---|---|---|---|
| 4,686,492 A | * | 8/1987 | Grellmann et al. | 333/33 |
| 5,583,468 A | * | 12/1996 | Kielmeyer et al. | 333/33 |
| 6,313,519 B1 | * | 11/2001 | Gainey et al. | 257/676 |
| 6,548,893 B1 | * | 4/2003 | Chen et al. | 257/704 |
| 6,784,090 B2 | * | 8/2004 | Fujihara | 438/614 |
| 6,908,843 B2 | * | 6/2005 | Baldonado et al. | 438/617 |

FOREIGN PATENT DOCUMENTS

| | | | |
|---|---|---|---|
| JP | 55-118643 | * | 9/1980 |
| JP | 2003-086621 | * | 3/2003 |

OTHER PUBLICATIONS

Abstract of JP 55-118643.*
Machine translation of JP2003-086621.*
Sutono et al., Experimental Modeling, Repeatability Investigation and Optimization of Microwave Bond Wire Interconnects, IEEE Transactions on Advanced Packaging, vol. 24, No. 4, 595-603 (Nov. 2001).
Alpha Industries, Circuit Models for Plastic Packaged Microwave Diodes, Application Note 1001, 1-4 (Jun. 1999).
Cherry et al., FDTD Analysis of High Frequency Electronic Interconnection Effects, IEEE Transactions on Microwave Theory and Techniques, vol. 43, No. 10, 2445-51 (Oct. 1995).
Yun et al., Parasitic Impedance Analysis of Double Bonding Wires for High-Frequency Integrated Circuit Packaging, IEEE Microwave and Guided Wave Letters, vol. 5, No. 9, 296-98 (Sep. 1995).

* cited by examiner

*Primary Examiner*—Jeremy C Norris

(57) ABSTRACT

Wire bonds connect current-carrying edges of high-frequency planar conductors to other electrical devices. In one embodiment, planar transmission lines are interconnected using two wire bonds. One bond wire extends from an edge of a first center conductor to a corresponding edge of a second center conductor, and a second bond wire extends from the other edge of the first center conductor to the other edge of the second center conductor. Embodiments include center conductors at different heights and having different widths, and different electrical devices, such as semiconductor integrated circuits. In a particular embodiment, ball bonding is used. In some embodiments, a tack bond is included after a ball bond to allow closer attachment of the bond wire to the edge of the conductor.

17 Claims, 4 Drawing Sheets

ELECTRICAL INTERCONNECTION FOR HIGH-FREQUENCY DEVICES

CROSS-REFERENCE TO RELATED APPLICATIONS

Not applicable.

STATEMENT REGARDING FEDERALLY SPONSORED RESEARCH OR DEVELOPMENT

Not applicable.

REFERENCE TO MICROFICHE APPENDIX

Not applicable.

FIELD OF THE INVENTION

The present invention relates generally to interconnecting high-frequency electrical devices, and more particularly to using wire bonds on the edges of a planar high-frequency device to electrically connect to another high-frequency device.

BACKGROUND OF THE INVENTION

Microwave integrated circuits ("MICs") typically consist of a number of separate high-frequency components, such as thin-film or thick-film transmission lines, semiconductor integrated circuits ("ICs"), active or passive electronic devices, and printed wiring boards ("PWBs"). MICs may also include surface-mount devices, integrated subcomponents, and grounding structures. The devices are electrically interconnected using a variety of techniques.

Microstrip and coplanar transmission lines are examples of planar transmission lines often used in MICs. In a microstrip transmission line, a center conductor is separated from a ground plane by a selected thickness of dielectric material to obtain a characteristic impedance of the transmission line. Fifty ohms is an example of a characteristic impedance often used in MICs. In a coplanar transmission line, ground planes extend along each side of a center conductor to obtain a characteristic impedance. In both cases, center conductors of adjacent transmission lines are typically connected together using one of four bonding methods: 1) a single wire bond between the center conductors of each transmission line, 2) parallel wires bonded symmetrically between the center conductors of each transmission line, 3) mesh bonding between the center conductors of each transmission line, and 4) ribbon bonding between the center conductors of each transmission line. Each of these bonding methods is also used to connect planar transmission lines to other devices.

At microwave frequencies, a single wire bonded between center conductors of adjacent transmission lines results in a signal discontinuity. In other words, the desired characteristic impedance is not maintained across the bond wire. The impedance of the bond wire is usually higher than 50 ohms, which is frequently the characteristic impedance of the transmission lines. The discontinuity leads to scattering and reflections of the incident signal, which degrades the performance of the MIC. Multiple bond wires create a similar discontinuity, but not as severe as a single bond wire.

Mesh and ribbon bonds have a lower impedance than a single bond wire or even multiple bond wires of similar length. However, mesh and ribbon bonds still present an impedance discontinuity. Unfortunately, mesh and ribbon bonds are more difficult to fabricate than wire bonds. Mesh bonding is a manual bonding process that uses fragile pieces of fine metal mesh that must be carefully handled by a skilled operator to avoid tearing. Ribbon bonding can be manual or automatic. Manual ribbon bonding can be as difficult as mesh bonding. Automatic ribbon bonding cannot easily adjust the ribbon width, and is not as flexible of a manufacturing process as wire bonding.

BRIEF SUMMARY OF THE INVENTION

An electrical interconnection includes a first planar transmission device having a first conductive region with a first edge and a second planar transmission device having a second conductive region with a second edge. The second edge is offset from the first edge. A bond wire is coupled to the first edge with a first bond and to the second edge with an second, or end, bond. In a particular embodiment the first and second planar transmission devices are planar transmission lines. In a further embodiment, a center conductor of the first planar transmission line is wider than a center conductor of the second planar transmission line. The edge-to-edge bonding between center conductors and other conductive regions improves impedance continuity between planar transmission devices, or between a planar transmission device and another component, such as a semiconductor IC.

In a particular embodiment a ball-bonding process is used to interconnect center conductors having different widths. Ball bonds are placed on the wider center conductor, and intermediate bonds (e.g. first tack or stitch bonds) are optionally placed nearer to the edges of the wider center conductor than the ball bonds. End bonds (e.g. second tack or stitch bonds) are placed near the edges of the narrower center conductor. In another embodiment, the ball bonds are staggered along the length of the first center conductor, which might not be sufficiently wide enough to accommodate side-by-side ball bonds.

Another embodiment connects coplanar transmission structures that have multiple center conductors. The edges of the center conductors of one coplanar transmission structure are connected to the corresponding edges of the center conductors of another coplanar transmission structure. In a further embodiment, the center conductors on one coplanar transmission structure are closer together than on the other. Edge-to-edge bonding provides improved impedance continuity from one planar transmission device to another.

DETAILED DESCRIPTION OF THE EMBODIMENTS

I. Introduction

The present invention enables connecting one planar transmission device to a component, such as another planar transmission device or an electronic device, with improved impedance continuity. Most of the current in a planar transmission device flows on the surface and along the edges of conductive regions, such as along the edges of the center conductors of microstrip or co-planar transmission lines, and along the opposing edges of slotline transmission structures. Conventional methods of interconnecting a planar transmission device to a component often result in the current flow having to "bend" from the edge of the conductive region to the bond, which is believed to degrade impedance continuity.

Figure 1A:
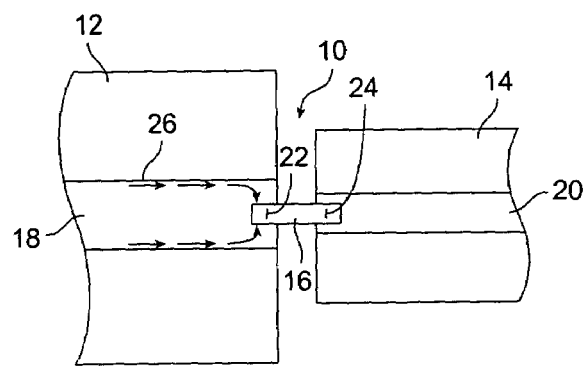
FIG. 1A shows a plan view of a prior art electrical interconnection.

FIG. 1A shows a plan view of a prior art electrical interconnection 10 connecting a first microstrip transmission line 12 to a second microstrip transmission line 14. The electrical interconnection 10 includes a ribbon 16 bonded to center conductors 18, 20 of the microstrip transmission lines 12, 14. The ribbon 16 is typically a small piece of thin gold or gold alloy that is connected to the center conductors 18, 20 with bonds 22, 24 using any of a variety of conventional methods, such as thermo-compression wedge bonding. Alternatively, conductive adhesive is used to secure the ribbon to one or both center conductors.

The inventors realized that current (represented as arrows) flowing along the edge 26 of the first center conductor 18 has to flow toward the bond 22 of the ribbon 16 to continue flowing along the second center conductor 20. It is believed that this change in the direction of the current flow degrades impedance continuity of the electrical interconnection 10.

Figure 1B:
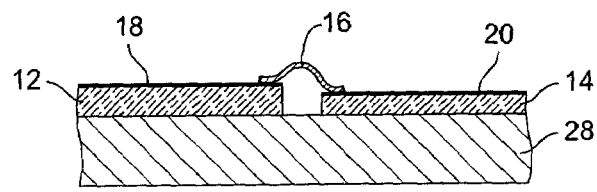
FIG. 1B shows a cross section of the prior art electrical interconnection of FIG. 1A

FIG. 1B shows a cross section of the prior art electrical interconnection of FIG. 1A. The first microstrip transmission line 12 and second microstrip transmission line 14 are mounted on a base 28, such as a metal package, typically with a conductive adhesive. The ribbon 16 is bonded to the first center conductor 18 and to the second center conductor 20 with a small arch. The arch allows the ribbon to flex without the bonds coming apart as the MIC thermally expands.

II. Exemplary Embodiments

Figure 2A:
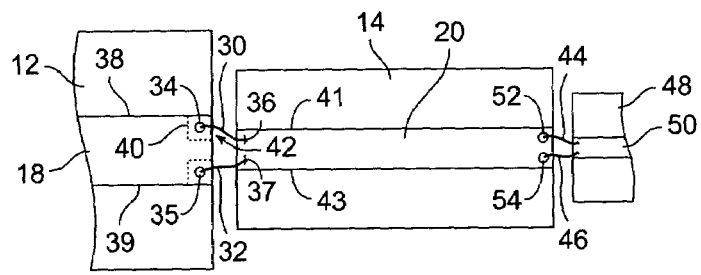
FIG. 2A shows a plan view of electrical interconnections according to embodiments of the present invention between planar transmission lines.

FIG. 2A shows a plan view of electrical interconnections between planar transmission lines according to an embodiment of the present invention. A first center conductor 18 of the first microstrip transmission line 12 is connected to the center conductor 20 of the second microstrip transmission line 14. A bond wire 30 is coupled to a first edge 38 of the first center conductor 18 with a first ball bond 34, and to a first edge 41 of the second center conductor 20 of the second microstrip transmission line 14 with a first end bond 36. Alternatively, a wedge bonder is used and a first wedge bond is used instead of the first ball bond, and the first end bond is a second wedge bond. For purposes of this patent application, a "bond wire" includes thin metal ribbon, such as is used in wedge bonders, as well as round wire, which is used in both capillary and wedge bonders. The first edge 38 of the first center conductor 18 is offset from the first edge 41 of the second center conductor 20, in other words, the edges 38, 41 of the center conductors 18, 20 do not lie along the same line. A second bond wire 32 is coupled to a first opposite edge 39 of the first center conductor 18 with a second ball bond 35, and to a first opposite edge 43 of the second center conductor 20 with a second end bond 37. Again, the edges 39, 43 are offset from each other. Alternatively, first and second bond wires are coupled to the center conductors using a wire-wedge bonder or other bonder.

The ball 34 of the bond wire 30 is placed as close to the edge 38 of the center conductor 18 as practical, and in one embodiment within a bond target area 40 (represented by dashed lines) extending from about 3 mils from the edge 38 of the center conductor 18 and about 3 mils from the end 42 of the center conductor 18. The bond wires 30, 32 angle in from the edges 38, 39 of the wider center conductor 18 to the edges 41, 43 of the narrower center conductor 20 to form what is called an "edge-to-edge" bond. The edge-to-edge bond improves impedance continuity.

Alternatively, the center conductor of the second planar microcircuit is essentially the same width as the center conductor of the first planar microcircuit and the end of the bond is also placed within a 3×3 mil bond target area on the second center conductor, or the ball is placed on the narrower center conductor and the end placed on the wider center conductor, or one ball is placed on the first center conductor, and the second ball is placed on the second center conductor.

Placing a bond within a 3×3 mil bond target area is attainable with current automatic bonding apparatus, and automatic bonding apparatus are particularly desirable when fabricating MICs according to embodiments of the invention because they provide a reliable, low-cost bond. A typical ball has a diameter of about 2.8 mils, and an exemplary automatic ball bonder has a placement accuracy of about 0.5 mils, which enables bonding to a bond target not smaller than 3 mils square. Other bonders have other tolerance ranges. The first and second edges 41, 43 of the second center conductor 20 are offset from the first and second edges 38, 39 of the first center conductor.

The width of the center conductor depends on several factors, such as the thickness of the substrate the transmission line is formed on, the substrate material, and the characteristic impedance of the transmission line. Microstrip transmission lines are chosen for simplicity of illustration. Alternative embodiments include coplanar and slotline transmission lines.

A second pair of bond wires 44, 46 connect the second planar transmission line 14 to a semiconductor IC 48. The semiconductor IC 48 includes a center conductor 50 that is narrower than the center conductor 20 of the second planar transmission line 14. Balls 52, 54 of the second pair of bond wires 44, 46 are placed as close to the edges of the center conductor 20 as practical to improve impedance continuity from the second planar transmission line 14 to the semiconductor IC 48. The end bonds are placed on the semiconductor IC 48. Alternatively, the semiconductor IC 48 has one or more bonding pads (not shown) instead of a transmission line. End bonds are stacked on top of one another if the bonding pad is too small to allow side-by-side bonding.

Figure 2B:
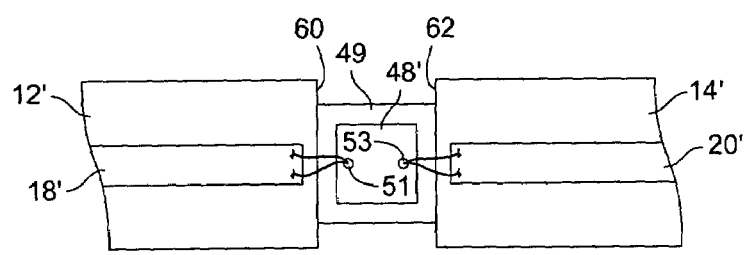
FIG. 2B shows electrical interconnections according to an embodiment of the present invention between a semiconductor IC and first and second planar transmission lines.

FIG. 2B shows electrical interconnections according to an embodiment of the present invention between a semiconductor IC 48' and first and second planar transmission lines 12', 14'. The semiconductor IC 48' is optionally mounted to a carrier 49, which facilitates handling of the semiconductor IC 48', promotes heat dissipation, and raises the height of the bonding pads 51, 53 of the semiconductor IC 48'. The first and second planar transmission lines 12', 14' are fabricated using PWB techniques, and the center conductors 18', 20' do not extend to the ends 60, 62 of the PWBs. Alternatively, an active or passive device, such as a capacitor, transistor, or diode, is used instead of the semiconductor IC 48'.

Figure 2C:
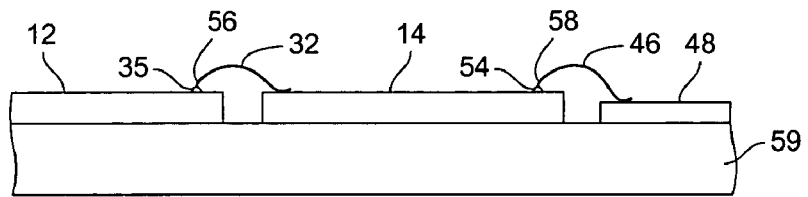
FIG. 2C shows a side view of a portion of the electrical interconnections of FIG. 2A.

FIG. 2C shows a side view of a portion of the interconnections of FIG. 2A. The first planar transmission line 12, second planar transmission line 14, and semiconductor IC 48 are mounted on a base 59, such as a package or carrier. The base 59 connects the ground planes of the first and second planar transmission lines to each other, and serves as a ground plane in the gaps between the planar transmission lines. The first planar transmission line 12 is thicker than the second planar transmission line 14, which is thicker than the semiconductor IC 48. Alternatively, the semiconductor IC 48 is mounted on a carrier (see FIG. 2B, ref. num. 49) that raises the height of the bonding surface of the semiconductor IC 48. In other embodiments, interconnected components of the MIC are essentially the same thickness.

The bond wires 32, 46 typically include essentially vertical portions 56, 58 where the bond wires extend from the balls 35, 54. The vertical portions 56, 58 are typical artifacts of the ball bonding process. These vertical portions 56, 58 create a discontinuity in current flow in high-frequency interconnections that can be reduced by using an intermediate bond (see FIG. 3A, ref. num. 80) between the ball bond and the end bond.

Figure 3A:
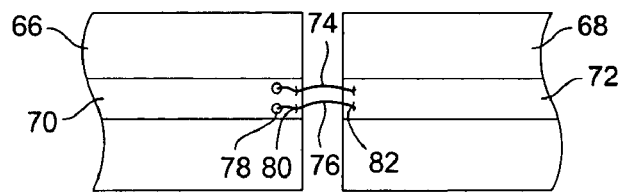
FIG. 3A shows a plan view of an electrical interconnection with intermediate bonds according to another embodiment of the present invention.

FIG. 3A shows a plan view of an electrical interconnection with intermediate bonds according to another embodiment of the present invention between planar transmission lines. Planar transmission lines 66, 68 have center conductors 70, 72 of essentially equal width. Alternatively, the center conductors have different widths. Bond wires 74, 76 couple the first center conductor 70 to the second center conductor 72. The bond wire 76 is connected to the first center conductor 70 with a ball bond 78 and an intermediate bond 80, which is commonly called a first stitch bond in an automatic capillary wire bonding process and a first tack bond in a manual capillary wire bonding process. The bond wire 76 is connected to the second center conductor 72 with an end bond 82, which is commonly called a second stitch bond in an automatic capillary wire bonding process and a second tack bond in a manual capillary wire bonding process. The designation "first" and "second" is arbitrary and used only for purposes of convenient discussion.

Following a ball bond with a first tack or stitch bond enables a flatter bond wire from the first component to the second component, and also enables placement of the tack or stitch bond closer to the edge of the center conductor than is otherwise achievable with a ball bond.

Figure 3B:
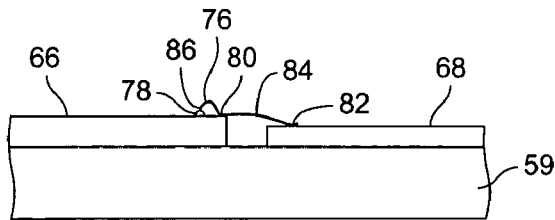
FIG. 3B shows a side view of the electrical interconnection of FIG. 3B.

FIG. 3B shows a side view of the electrical connection of FIG. 3A. The ball bond 78 attaches a bond wire 76 to the first planar transmission line 66. The intermediate bond 80 is placed close to the end of the first planar transmission line 66 and the end bond 82 is placed close to the end of the second planar transmission line 68. The position of the stitch or tack bond is typically closer to the edge than that of the ball bond because the ball is larger than the diameter of the bond wire. Embodiments of the present invention include ball bonds that are farther from the edge of a center conductor than tack bonds. In other words, the bond wire from the ball bond angles toward the edge or corner where the intermediate bond is placed.

The portion 84 of the bond wire 76 between the intermediate bond 80 and the end bond 82 is relatively straight, and in this case level, compared to a vertical portion 86 of the bond wire extending from the ball bond 78. The vertical portion 86 is an artifact of typical ball bonding processes. Relatively little current flows in the bond wire 76 between the ball bond 78 and the intermediate bond 80, and it is believed that the portion 84 of the bond wire between the intermediate bond 80 and the end bond 82 provides good impedance continuity.

Ball bond apparatus use a fine (e.g. 0.7 mil gold) wire extending through a capillary. A ball is formed on the end of the wire by melting a small length of wire when the subsequent bonding sequence has finished. The capillary presses the ball onto a bonding target, which is typically metal. The ball adheres to the bonding target, and the capillary is raised, feeding wire as the capillary is moved to a second bonding target. A tack or stitch bond is formed by bringing the capillary down on the bond wire over the second bonding target. The bond wire is held in slight tension between the ball and where it enters the capillary. The contact area of the tack or stitch bond is smaller, being slightly greater than the wire diameter, than the contact area of the ball bond. This allows closer placement of the tack or stitch bond (and subsequent end bond) to the edge of the center conductor or other current-carrying structure. Thus using intermediate bonds, particularly on center conductors or other structures where ball bonds are difficult to place close to the edge of the center conductor, enables electrical interconnections with good impedance characteristics. Alternative embodiments use wire wedge bonding techniques. Wire wedge bonding is particularly desirable when bonding to a small (less than 3 mil) target area.

A wire wedge bonder is similar to a capillary ball bonder except that wire is fed under a wedge, rather than through a capillary. A wire wedge bonder produces a first wedge bond similar to a tack or stitch bond of a capillary ball bonder in that the first wedge bond is smaller than a ball bond. However, the wire in a wedge bonder is pulled in a fairly straight line away from the prior bond so that the bond wire does not slip off from under the wedge. A capillary bonder can move in essentially any direction from the first (ball) bond.

Figure 3C:
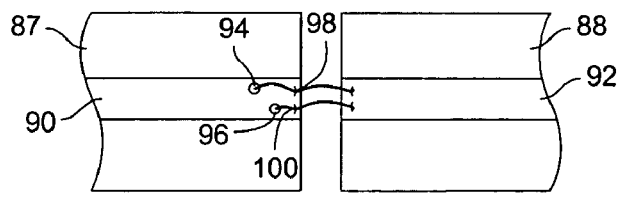
FIG. 3C shows a plan view of an edge-to-edge electrical interconnection with staggered ball bonds according to another embodiment of the present invention.

FIG. 3C shows a plan view of an edge-to-edge electrical interconnection with staggered ball bonds according to another embodiment of the present invention. The center conductors 90, 92 of planar microcircuits 87, 88 are too narrow to easily place side-by-side ball bonds because the width of the center conductor is less than twice the width (measured from the edge of the center conductor) of a bond target area (e.g. less than 6 mils for a 3×3 mil bond target area). Ball bonds 94, 96 are staggered along the length of the center conductor 90 to provide room for each ball bond. Intermediate bonds 98, 100, are placed closer to the edges of the center conductor than the ball bonds 94, 96, which improve impedance continuity of the electrical interconnection.

Figure 4:
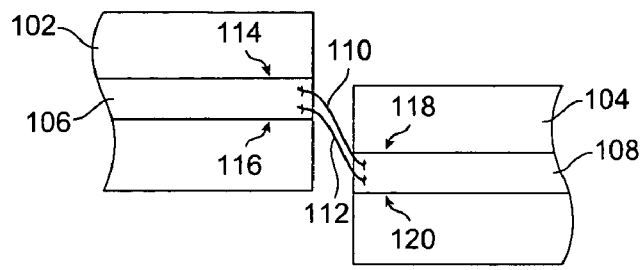
FIG. 4 shows a plan view of an electrical connection according to an embodiment of the present invention between a first planar transmission line and a second planar transmission line offset from the first planar transmission line.

FIG. 4 shows a plan view of an electrical interconnection according to an embodiment of the present invention between a first planar transmission line 102 offset from a second planar transmission line 104. In other words, center conductors 106, 108 of the planar transmission lines do not lie along the same axis. Edge-to-edge bond wires 110, 112 connect edges 114, 116 of the first center conductor 106 to the edges 118, 120 of the second center conductor 108. Interconnections with good impedance continuity between offset transmission lines using conventional mesh or ribbon bonding techniques is difficult; however, edge-to-edge wire bonding enables offset interconnections with good impedance continuity.

Figure 5:
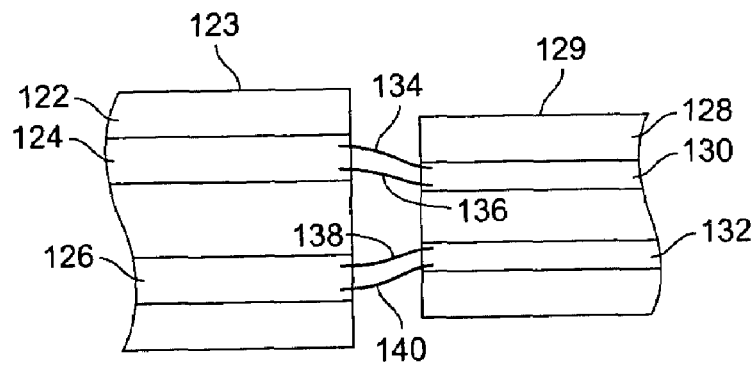
FIG. 5 shows a plan view of electrical interconnections according to an embodiment of the present invention connecting a first coplanar stripline circuit to a second coplanar stripline circuit.

FIG. 5 shows a plan view of electrical interconnections according to an embodiment of the present invention connecting a first coplanar stripline circuit 122 on a first substrate 123 to a second coplanar stripline circuit 128 on a second substrate 129. The first coplanar stripline circuit 122 has a first center conductor 124 and a second center conductor 126 edge-to-edge bonded to a third center conductor 130 and a fourth center conductor 132 of the second coplanar stripline circuit 128. Coplanar stripline circuits may be shielded with ground planes above and/or below the center conductors.

The first and second center conductors, and hence their edges, are offset from the third and fourth center conductors. Bond wires 134, 136 form edge-to-edge bonds between the first center conductor 124 and the third center conductor 130, and bond wires 138, 140 form edge-to-edge bonds between the second center conductor 126 and the fourth center conductor 132. Coplanar stripline circuits are useful in several applications, such as when differential signals are coupled along a signal path. Alternatively, the edges of the first and second center conductors of the first coplanar stripline circuit are wire bonded to differential inputs or differential outputs of a semiconductor IC. In yet another embodiment, additional edge-to-edge bonds are provided between additional conductive regions, such as additional center conductors of coplanar striplines lines or ground planes of co-planar transmission lines.

Figure 6:
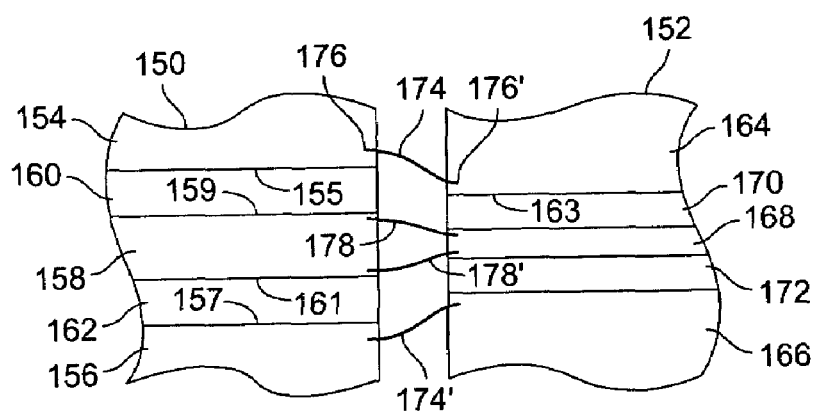
FIG. 6 shows a plan view of electrical interconnections according to embodiments of the present invention connecting a first coplanar transmission line to a second coplanar transmission line.

FIG. 6 shows a plan view of electrical interconnections according to embodiments of the present invention connecting a first coplanar transmission line to a second coplanar transmission line. Coplanar transmission lines are generally transmission structures where the center conductor(s) and ground plane(s) lie in the same plane, such as ground-signal-ground transmission lines and ground-signal transmission lines. An example of ground-signal-ground coplanar transmission lines is shown in FIG. 6. The first coplanar transmission line 150 has ground planes 154, 156 separated from a center conductor 158 by dielectric regions 160, 162, and is called a ground-signal-ground transmission line. The second coplanar transmission line 152 also has ground planes 164, 166 separated from a center conductor 168 by dielectric regions 170, 172. In a coplanar transmission line, most of the current in the ground planes 154, 156 is carried along the edges 155, 157 of the ground planes that are proximate to the center conductor, and most of the current in the center conductor 158 is carried along the edges 159, 161 of the center conductor 158 proximate to the ground planes 154, 156. Alternatively, the transmission lines are ground-signal transmission lines. A ground-signal transmission line is similar to a ground-signal-ground transmission line with one of the ground planes omitted.

The edge 155 of the ground plane 154 of the first coplanar transmission line 150 is offset from the corresponding edge 163 of the ground plane 164 of the second coplanar transmission line 152. A bond wire 174 connects a corner 176 of the ground plane 154 of the first coplanar transmission line 150 to a corner 176' of the ground plane 164 of the second coplanar transmission line 152 to form an edge-to-edge bond. Another bond wire 174' connects the corner of the other ground plane 156 of the first coplanar transmission line 150 to the corner of the other ground plane 166 of the second coplanar transmission line 152 to form another edge-to-edge bond. In a particular embodiment, the bond wires are bonded to the ground planes within three mils of the edge of each ground plane. Bond wires 178, 178' also connect the corners of the first center conductor 158 to the corners of the second center conductor 168. The edge-to-edge bonds form an electrical interconnection with improved impedance continuity.

The width of the center conductor and the spacing of the ground planes from the center conductor depend on several factors, such as the dielectric constant of the material the transmission line is formed on and the characteristic impedance of the transmission line. The second coplanar transmission line 152 is shown with a narrower center conductor and closer ground planes than the first coplanar transmission line 150 to illustrate how the bond wires 174, 174', 178, 178' angle in from the first coplanar transmission line 150 to the second coplanar transmission line 152. Alternatively, the center conductors and spacing of the ground plane of the first coplanar transmission line are similar to the second coplanar transmission line. In a particular embodiment, an automatic wire bonder is used to form the edge-to-edge interconnection between the two coplanar transmission lines. Automatic wire bonders use imaging technology to place bonds in identified target areas, and are typically much quicker and more repeatable than manual wire bonding.

Figure 7:
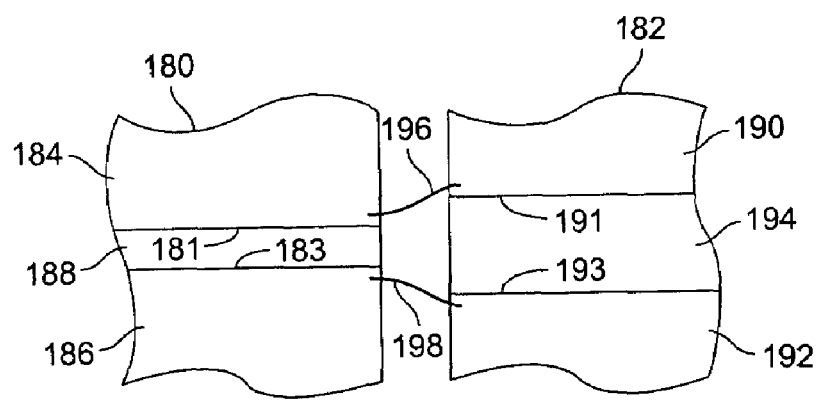
FIG. 7 shows a plan view of an electrical interconnection between slot lines according to an embodiment of the present invention.

FIG. 7 shows a plan view of an electrical interconnection between slot lines according to an embodiment of the present invention. The first slot line includes a first conductive plane 184 separated from a second conductive plane 186 by a dielectric region 188. The second slot line also includes conductive planes 190, 192 separated by a dielectric region 194. An edge 181 of the conductive plane 184 of the first slot line 180 is connected to an edge 191 of the conductive plane 190 of the second slot line 182 with a bond wire 196. An edge 183 of the second conductive plane 186 of the first slot line 180 is connected to an edge 193 of the second conductive plane 192 of the second slot line 182 with a second bond wire 198. In a slot line, most of the current flows along the edges of the opposing conductive planes. Placing the bonds close to the edges of the conductive planes improves impedance continuity.

III. Experimental Results

Figure 8A:
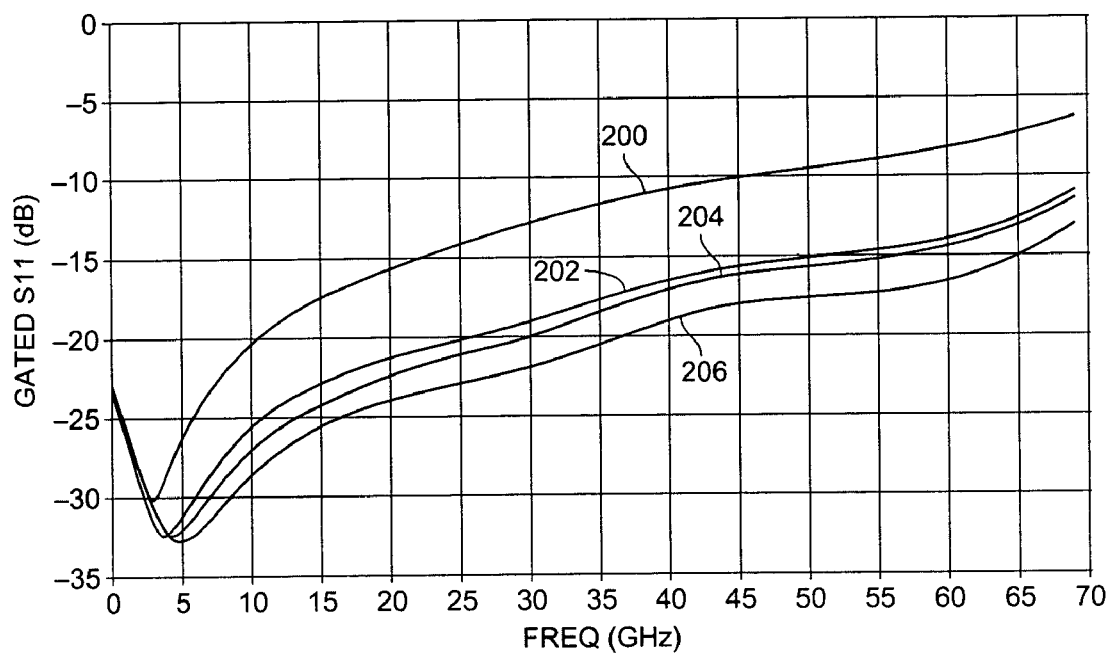
FIGS. 8A and 8B show plots comparing the return loss versus frequency for edge-to-edge electrical interconnections according to embodiments of the present invention to the insertion losses for conventional electrical interconnections.

FIG. 8A shows plots comparing the return loss versus frequency for an edge-to-edge interconnection between transmission lines according to an embodiment of the present invention to the return losses for conventional interconnects. Return loss is a measure of the similarity in impedance of an electrical interconnection. A low return loss indicates an electrical interconnection with good impedance continuity. A time-domain reflectometer ("TDR") technique was used to measure the return loss ($S_{11}$) of samples made using 50-ohm thin-film microstrip transmission lines fabricated on 10 mil (thick) fused-silica substrates connected to 50-ohm thin-film microstrip transmission lines fabricated on 5 mil sapphire substrates. The center conductors of the transmission lines made on the fused silica substrates were wider than the center conductors of the transmission lines made on the sapphire substrates.

All bonding was done manually. The return loss of a single bond wire between the center conductors of the microstrip transmission lines is shown in a first curve 200. The return loss of a mesh bond is shown in a second curve 202, and the return loss of a ribbon bond is shown in a third curve 204. The single bond wire, mesh, and ribbon were bonded to approximately the middle of each center conductor. The return loss of an edge-to-edge bond wire electrical interconnection according to an embodiment of the present invention (ref FIGS. 2A and 2C) is shown in a fourth curve 206. In comparison, the return loss of the edge-to-edge wire bond was better than the single wire bond, the mesh bond and the ribbon bond between about 5 GHz to about 67 GHz.

Figure 8B:
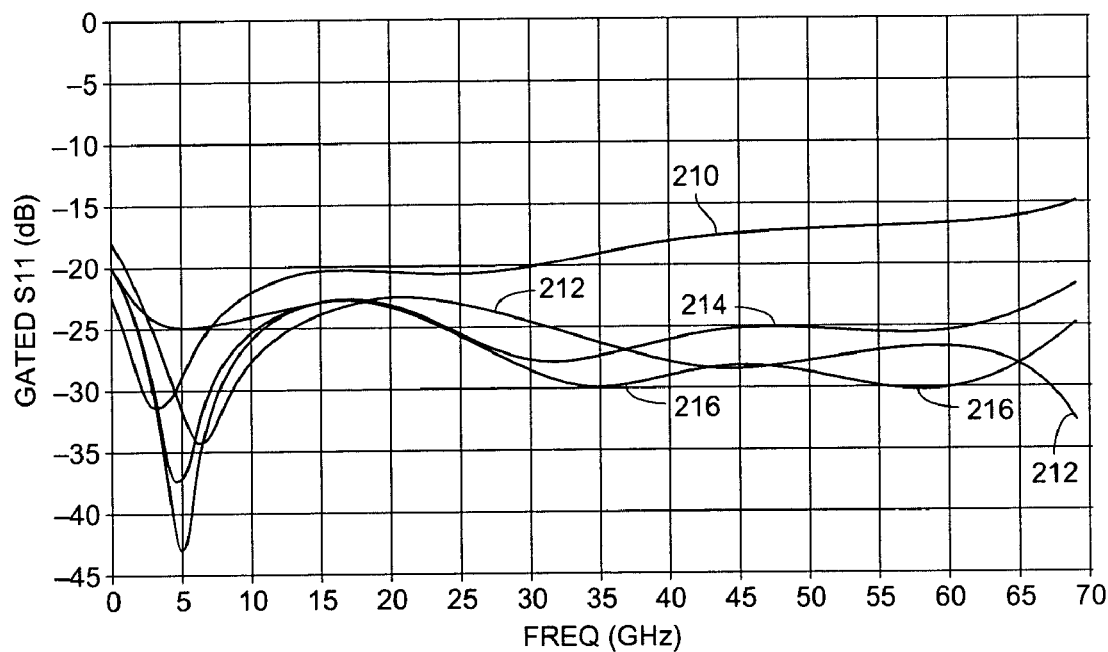

FIG. 8B shows plots comparing the return loss versus frequency for an edge-to-edge interconnect between a transmission line and a semiconductor IC according to an embodiment of the present invention to the return losses for conventional interconnects. The transmission line was a 50-ohm thin-film microstrip transmission line on 5-mil sapphire. The semiconductor IC was also about 5 mils thick and had a bonding pad about 3×3 mils. The center conductor of the microstrip transmission line was about 4 mils wide. A bond wire extended from each edge of the center conductor to the bonding pad on the semiconductor IC, as shown in FIG. 2B.

A first curve 210 plots return loss for a single wire bond. A second curve 212 plots return loss for a ribbon bond. A third curve 214 plots return loss for a mesh bond, and a fourth curve 216 plots return loss for the edge-to-edge wire bond interconnect. The edge-to-edge wire bond interconnect has better return loss between about 5 GHz and about 65 GHz than the single wire bond and mesh bond, and performance comparable to the ribbon bond.

FIGS. 8A and 8B show that edge-to-edge wire bond interconnects are superior to single wire and mesh bonds and offers similar or superior performance compared to a ribbon bond in the illustrated examples. Edge-to-edge wire bond interconnects can be automated in several instances, providing high-performance, inexpensive, reliable interconnects for high-frequency application.

While the preferred embodiments of the present invention have been illustrated in detail, it should be apparent that modifications and adaptations to these embodiments might occur to one skilled in the art without departing from the scope of the present invention as set forth in the following claims.

What is claimed is:

1. An electrical interconnection comprising:
a first planar transmission device having a first conductive region with a first edge;
a second planar transmission device having a second conductive region with a second edge, the second edge being offset from the first edge; and
a bond wire coupled to the first edge with a first bond and to the second edge with a second bond;
wherein the first bond includes a first ball bond and a first intermediate bond, the first intermediate bond being closer to the first edge than the first ball bond; and
wherein the first conductive region is a first center conductor of a first planar transmission line, the second conductive region is a second center conductor of a second planar transmission line, and the electrical interconnection further comprises
a first opposite edge of the first center conductor;
a second opposite edge of the second center conductor; and
a second bond wire coupled to the first opposite edge with a third bond and to the second opposite edge with a fourth bond.

2. The electrical interconnection of claim 1 wherein the first center conductor is wider than the second center conductor.

3. An electrical interconnection comprising:
a first planar transmission device having a first conductive region with a first edge;
a second planar transmission device having a second conductive region with a second edge, the second edge being offset from the first edge; and
a bond wire coupled to the first edge with a first bond and to the second edge with a second bond;
wherein the first bond includes a first ball bond and a first intermediate bond, the first intermediate bond being closer to the first edge than the first ball bond; and
wherein the first conductive region is a first center conductor of a first planar transmission line, the second conductive region is a second center conductor of a second planar transmission line, and the electrical interconnection further comprises
a first opposite edge of the first center conductor;
a second opposite edge of the second center conductor; and
a second bond wire coupled to the first opposite edge with a third bond and to the second opposite edge with a fourth bond;
wherein the first opposite edge is offset from the second opposite edge.

4. An electrical interconnection comprising:
a first planar transmission device having a first conductive region with a first edge;
a second planar transmission device having a second conductive region with a second edge, the second edge being offset from the first edge; and
a bond wire coupled to the first edge with a first bond and to the second edge with a second bond,
wherein the first bond includes a first ball bond and a first intermediate bond, the first intermediate bond being closer to the first edge than the first ball bond; and
wherein the distance between the first intermediate bond and the second bond is smaller than the distance between the first ball bond and the second bond.

5. An electrical interconnection comprising:
a first planar transmission device having a first conductive region with a first edge;
a second planar transmission device having a second conductive region with a second edge, the second edge being offset from the first edge; and
a bond wire coupled to the first edge with a first bond and to the second edge with a second bond;
wherein the first bond includes a first ball bond and a first intermediate bond, the first intermediate bond being closer to the first edge than the first ball bond; and
wherein the first conductive region is a first center conductor of a first planar transmission line, the second conductive region is a second center conductor of a second planar transmission line, and the electrical interconnection further comprises
a first opposite edge of the first center conductor;
a second opposite edge of the second center conductor; and
a second bond wire coupled to the first opposite edge with a third bond and to the second opposite edge with a fourth bond;
wherein the third bond includes a second ball bond and a second intermediate bond, the first ball bond being closer to an end of the first center conductor than the second ball bond.

6. An electrical interconnection comprising:
a first planar transmission device having a first conductive region with a first edge;

a second planar transmission device having a second conductive region with a second edge, the second edge being offset from the first edge; and a bond wire coupled to the first edge with a first bond and to the second edge with a second bond, wherein the first bond includes a first ball bond and a first intermediate bond, the first intermediate bond being closer to the first edge than the first ball bond; and wherein the first conductive region is a first center conductor of a first planar transmission line, the second conductive region is a second center conductor of a second planar transmission line, and the electrical interconnection further comprises a first opposite edge of the first center conductor;

a second opposite edge of the second center conductor; and a second bond wire coupled to the first opposite edge with a third bond and to the second opposite edge with a fourth bond;

wherein the third bond includes a second ball bond and a second intermediate bond, the first ball bond being closer to an end of the first center conductor than the second ball bond; and wherein the first center conductor has a width less than or equal to twice a bond target width.

7. An electrical interconnection comprising:

a first planar transmission device having a first conductive region with a first edge;

a second planar transmission device having a second conductive region with a second edge, the second edge being offset from the first edge; and a bond wire coupled to the first edge with a first bond and to the second edge with a second bond;

wherein the first bond includes a first ball bond and a first intermediate bond, the first intermediate bond being closer to the first edge than the first ball bond; and wherein the first conductive region is a first center conductor of a first planar transmission line, the second conductive region is a second center conductor of a second planar transmission line, and the electrical interconnection further comprises a first opposite edge of the first center conductor;

a second opposite edge of the second center conductor; and a second bond wire coupled to the first opposite edge with a third bond and to the second opposite edge with a fourth bond;

wherein the first planar transmission device is a first microstrip transmission line and the second planar transmission device is a second microstrip transmission line.

8. An electrical interconnection comprising:

a first planar transmission device having a first conductive region with a first edge;

a second planar transmission device having a second conductive region with a second edge, the second edge being offset from the first edge; and a bond wire coupled to the first edge with a first bond and to the second edge with a second bond, wherein the first bond includes a first ball bond and a first intermediate bond, the first intermediate bond being closer to the first edge than the first ball bond; and wherein the first conductive region is a first ground plane of a first co-planar transmission line and the second conductive region is a second ground plane of a second co-planar transmission line.

9. An electrical interconnection comprising:

a first planar transmission device having a first conductive region with a first edge;

a second planar transmission device having a second conductive region with a second edge, the second edge being offset from the first edge; and a bond wire coupled to the first edge with a first bond and to the second edge with a second bond, wherein the first bond includes a first ball bond and a first intermediate bond, the first intermediate bond being closer to the first edge than the first ball bond; and wherein the first planar transmission device is a first slot line and the second planar transmission device is a second slot line.

10. An electrical interconnection comprising:

a first planar transmission device having a first conductive region with a first edge;

a second planar transmission device having a second conductive region with a second edge, the second edge being offset from the first edge; and a bond wire coupled to the first edge with a first bond and to the second edge with a second bond, wherein the first bond includes a first ball bond and a first intermediate bond, the first intermediate bond being closer to the first edge than the first ball bond; and wherein the second planar transmission device comprises an integrated circuit and further comprising:

a second bond wire coupled to an opposite edge of the first conductive region with a third bond and to the second conductive region with a fourth bond.

11. An electrical interconnection comprising:

a first planar transmission device having a conductive region with a first edge and a second edge;

a component;

a first bond wire coupled to a first edge with a first ball bond and a first intermediate bond, and to the component with a first end bond: and a second bond wire coupled to the second edge with at least a second ball bond and to the component with a second end bond, wherein the first intermediate bond is closer to the first edge than the first ball bond.

12. The electrical interconnection of claim 11 wherein the first planar transmission device is a planar transmission line and the conductive region is a center conductor of the planar transmission line.

13. The electrical interconnection of claim 11 wherein the component is a second planar transmission line having a second center conductor, the first bond wire being coupled to a first edge of the second center conductor, and the second bond wire being coupled to a second edge of the second center conductor.

14. The electrical interconnection of claim 11 wherein the component is an integrated circuit.

15. The electrical interconnection of claim 11 further comprising a second intermediate bond coupling the second bond wire to the second edge, wherein the first ball bond is closer to an end of the center conductor than the second ball bond.

16. The electrical interconnection of claim 11 wherein the conductive region of the first planar transmission device comprises a first center conductor and wherein the component is a second planar transmission line having a second center conductor narrower than the first center conductor.

17. The electrical interconnection of claim 11 wherein the first planar transmission device is a first coplanar stripline transmission structure having a first center conductor and a second center conductor and the component is a second coplanar stripline transmission structure having a third center conductor and fourth center conductor.

* * * * *